United States Patent
Kobayashi et al.

(10) Patent No.: US 12,308,682 B2
(45) Date of Patent: May 20, 2025

(54) CONTROL PARAMETER CALCULATION DEVICE, POWER SUPPLY SYSTEM, CONTROL PARAMETER CALCULATION METHOD, AND PROGRAM

(71) Applicant: MITSUBISHI HEAVY INDUSTRIES, LTD., Tokyo (JP)

(72) Inventors: Yu Kobayashi, Tokyo (JP); Yusuke Yashiro, Tokyo (JP); Masayuki Hashimoto, Tokyo (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 12 days.

(21) Appl. No.: 18/287,271

(22) PCT Filed: Apr. 22, 2022

(86) PCT No.: PCT/JP2022/018617
§ 371 (c)(1),
(2) Date: Oct. 17, 2023

(87) PCT Pub. No.: WO2022/259777
PCT Pub. Date: Dec. 15, 2022

(65) Prior Publication Data
US 2024/0204548 A1 Jun. 20, 2024

(30) Foreign Application Priority Data
Jun. 8, 2021 (JP) .................. 2021-095972

(51) Int. Cl.
*H02J 7/00* (2006.01)
*G01R 31/36* (2020.01)
(Continued)

(52) U.S. Cl.
CPC .......... *H02J 7/005* (2020.01); *G01R 31/3648* (2013.01); *G01R 31/392* (2019.01);
(Continued)

(58) Field of Classification Search
CPC ...... H02J 7/00; H02J 7/005; H02J 1/10; H02J 7/0013; G01R 31/392; G01R 31/3648; G06Q 30/0283
See application file for complete search history.

(56) References Cited

U.S. PATENT DOCUMENTS

2022/0060016 A1  2/2022  Mitsunaga

FOREIGN PATENT DOCUMENTS

| JP | 6110771 B2 | 4/2017 |
| JP | 6768571 B2 | 10/2020 |
| WO | 2020/161765 A1 | 8/2020 |

OTHER PUBLICATIONS

International Search Report dated Jul. 5, 2022, issued in counterpart Application No. PCT/JP2022/018617 with English Translation. (4 pages).

(Continued)

*Primary Examiner* — Robert L Deberadinis
(74) *Attorney, Agent, or Firm* — WHDA, LLP (57) ABSTRACT

A control parameter calculation device comprises an integration unit that calculates the target value of combined power obtained by summing a first power and a second power by smoothing the first power on the basis of the value of a predetermined control parameter and calculates charge/discharge power when charging and discharging are performed so as to achieve the target value; a smoothing performance calculation unit that calculates a smoothing performance evaluation index of the combined power on the basis of the charge/discharge power calculated over an evaluation period; a lifetime calculation unit that calculates a lifetime evaluation index of the battery during the evaluation period on the basis of the calculated charge/discharge power; and an evaluation unit that evaluates the value of a control parameter on basis of the smoothing performance (Continued)

evaluation index and the lifetime evaluation index which are calculated repeatedly while varying the value of the control parameter.

8 Claims, 7 Drawing Sheets

(51) Int. Cl.
    *G01R 31/392*     (2019.01)
    *G06Q 30/0283*     (2023.01)
    *H02J 1/10*     (2006.01)

(52) U.S. Cl.
    CPC ............ *G06Q 30/0283* (2013.01); *H02J 1/10* (2013.01); *H02J 7/0013* (2013.01)

(56) References Cited

OTHER PUBLICATIONS

Written Opinion dated Jul. 5, 2022, issued in counterpart Application No. PCT/JP2022/018617, with English Translation. (8 pages).

| POINT | MOVING AVERAGE TIME |
|---|---|
| P1 | T1 |
| P2 | T2 |
| P3 | T3 |
| P4 | T4 |
| P5 | T5 |
| P6 | T6 |
| P7 | T7 |
| P8 | T8 |

NOTE THAT, T1 < T2 < T3 < T4 < T5 < T6 < T7 < T8

CONTROL PARAMETER CALCULATION DEVICE, POWER SUPPLY SYSTEM, CONTROL PARAMETER CALCULATION METHOD, AND PROGRAM

TECHNICAL FIELD

The present disclosure relates to a control parameter calculation device, a power supply system, a control parameter calculation method, and a program.

Priority is claimed to Japanese Patent Application No. 2021-095972, filed Jun. 8, 2021, the contents of which are incorporated herein by reference.

BACKGROUND ART

Provided is a technique of suppressing output fluctuation of renewable-energy power generation, such as solar power generation or wind power generation, by charging and discharging from a secondary battery (for example, PTL 1). PTL 2 discloses a power feeding system capable of extending the lifetime of a secondary battery as well as providing stable supply of power. In a state where the degradation of the secondary battery has progressed, the power feeding system described in PTL 2 performs control of suppressing a charge/discharge operation (performing slow charging/discharging) to extend the battery lifetime. PTL 3 discloses a method of estimating a degradation amount of a secondary battery.

CITATION LIST

Patent Literature

[PTL 1] Japanese Patent No. 6768571
[PTL 2] International Publication No. 2020/161765
[PTL 3] Japanese Patent No. 6110771

SUMMARY OF INVENTION

Technical Problem

For example, as disclosed in PTL 2, the control of extending the battery lifetime is provided, but there is no technique of specifically determining how to set a value of a control parameter to perform charge/discharge control in response to a user's request for extending battery lifetime even though smoothing performance by the charging and discharging of the secondary battery is sacrificed to some extent.

The present disclosure provides a control parameter calculation device, a power supply system, a control parameter calculation method, and a program capable of solving the above problems.

Solution to Problem

According to one aspect of the present disclosure, a control parameter calculation device includes an integration unit that calculates a target value of combined power obtained by totaling first power generated by a renewable-energy power generation system and second power charged and discharged by a battery by smoothing the first power based on a predetermined value of a control parameter, and calculates charge/discharge power in a case where the battery is charged and discharged such that the calculated target value is achieved, a smoothing performance calculation unit that calculates, based on the charge/discharge power calculated by the integration unit over a predetermined evaluation period, a smoothing performance evaluation index of the combined power in the evaluation period, a lifetime calculation unit that calculates, based on the charge/discharge power calculated by the integration unit over the predetermined evaluation period, a lifetime evaluation index of the battery in the evaluation period, and an evaluation unit that evaluates the value of the control parameter based on the smoothing performance evaluation index and the lifetime evaluation index calculated using the charge/discharge power repeatedly calculated by the integration unit while changing the value of the control parameter.

According to one aspect of the present disclosure, a power supply system includes a renewable-energy power generation system, a battery system provided with one or a plurality of batteries, the control parameter calculation device, and a power control device that calculates the target value based on the value of the control parameter evaluated by the control parameter calculation device and performs charge/discharge control of the battery system based on a difference between the calculated target value and the power generated by the renewable-energy power generation system.

According to one aspect of the present disclosure, a control parameter calculation method includes a step of calculating a target value of combined power obtained by totaling first power generated by a renewable-energy power generation system and second power charged and discharged by a battery by smoothing the first power based on a predetermined value of a control parameter, and of calculating charge/discharge power in a case where the battery is charged and discharged such that the calculated target value is achieved, a step of calculating, based on the charge/discharge power calculated in the step of calculating the charge/discharge power over a predetermined evaluation period, a smoothing performance evaluation index of the combined power in the evaluation period, a step of calculating, based on the charge/discharge power calculated in the step of calculating the charge/discharge power, a lifetime evaluation index of the battery in the evaluation period, and a step of evaluating the value of the control parameter based on the smoothing performance evaluation index and the lifetime evaluation index, which are calculated by repeatedly performing the step of calculating the charge/discharge power, the step of calculating the smoothing performance evaluation index, and the step of calculating the lifetime evaluation index while changing the value of the control parameter.

According to one aspect of the present disclosure, a program causes a computer to execute a step of calculating a target value of combined power obtained by totaling first power generated by a renewable-energy power generation system and second power charged and discharged by a battery by smoothing the first power based on a predetermined value of a control parameter, and of calculating charge/discharge power in a case where the battery is charged and discharged such that the calculated target value is achieved, a step of calculating, based on the charge/discharge power calculated in the step of calculating the charge/discharge power over a predetermined evaluation period, a smoothing performance evaluation index of the combined power in the evaluation period, a step of calculating, based on the charge/discharge power calculated in the step of calculating the charge/discharge power, a lifetime evaluation index of the battery in the evaluation period, and a step of evaluating the value of the control parameter based on the smoothing performance evaluation index and the lifetime evaluation index, which are calculated by repeatedly performing the step of calculating the charge/discharge power, the step of calculating the smoothing performance evaluation index, and the step of calculating the lifetime evaluation index while changing the value of the control parameter.

Advantageous Effects of Invention

With the control parameter calculation device, the power supply system, the control parameter calculation method, and the program described above, it is possible to calculate the specific value of the control parameter.

DESCRIPTION OF EMBODIMENTS

Hereinafter, a control parameter calculation method of the present disclosure will be described with reference to FIGS. 1 to 7. In the following description, the same reference numerals are assigned to configurations having the same or similar functions. Redundant descriptions of such configurations may be omitted.

(System Configuration)

Figure 1:
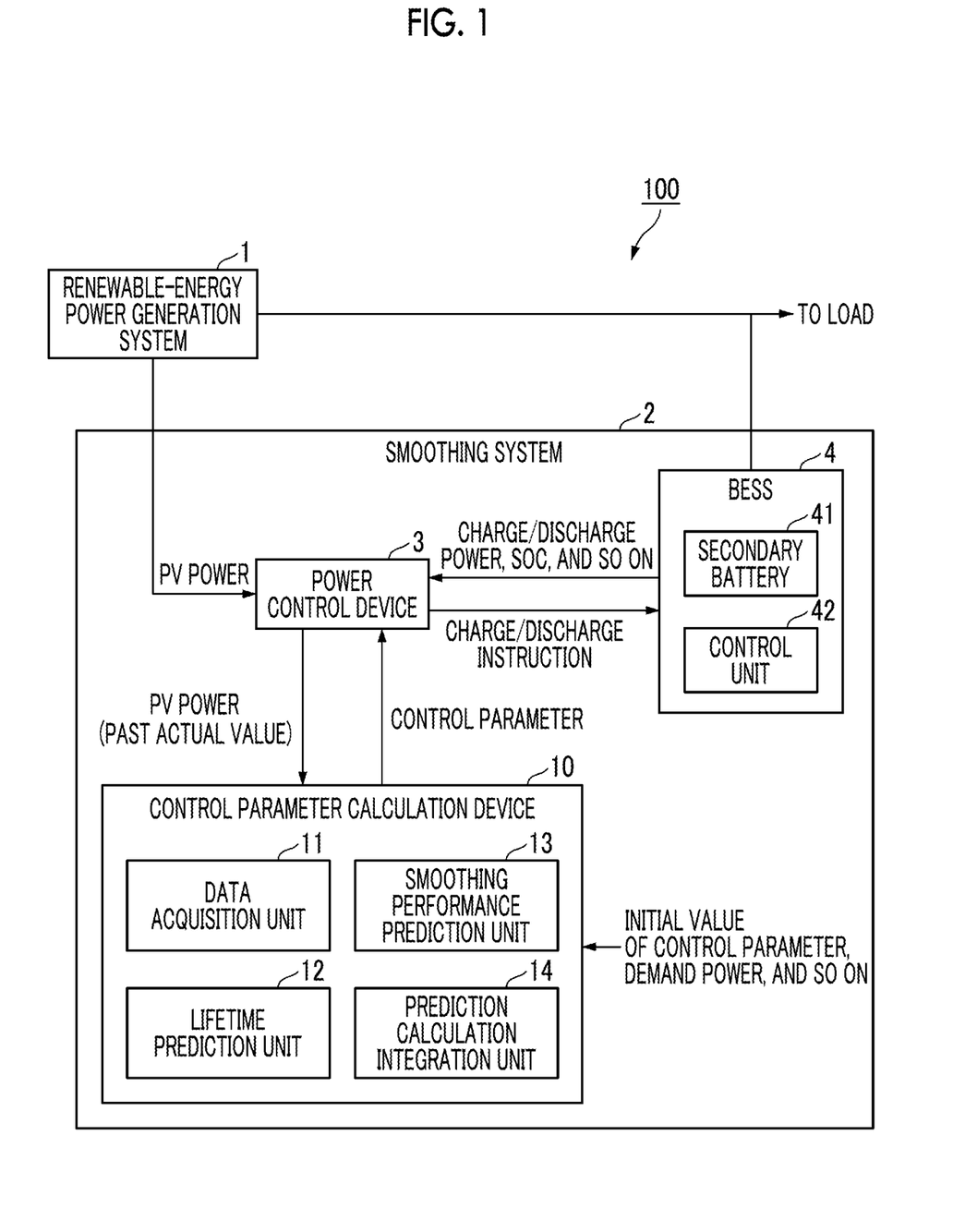
FIG. 1 is a diagram showing an example of a power supply system according to a first embodiment.

FIG. 1 is a diagram showing an example of a power supply system according to a first embodiment.

The power supply system 100 includes a renewable-energy power generation system 1 such as solar power generation, wind power generation, hydraulic power generation, geothermal power generation, and biomass power generation, and a smoothing system 2. The smoothing system 2 smooths fluctuation in an output (generated power) of the renewable-energy power generation system 1. The power supply system 100 supplies power generated by the renewable-energy power generation system 1 and smoothed by the smoothing system 2 to a load such as a facility, such as a factory, or a commercial power system. Hereinafter, the power generated by the renewable-energy power generation system 1 will be abbreviated as PV power (PV is an abbreviation for photovoltaic, and the scope of application of the present disclosure is not limited to solar power generation). The smoothing system 2 includes a power control device 3, a BESS 4, and a control parameter calculation device 10.

The battery energy storage system (BESS) 4 is provided with a secondary battery 41 such as one or a plurality of lithium batteries or a lead battery and a control unit 42 that performs charge/discharge control of the secondary battery 41, and plays a role of absorbing and stabilizing output fluctuation of the renewable-energy power generation system 1. The power control device 3 acquires an actual value of the PV power from the renewable-energy power generation system 1 and smooths the value of the PV power acquired in a predetermined period immediately before to calculate a target value of power supplied to a load by the power supply system 100. This target value is referred to as a smoothing target value. For example, the power control device 3 calculates the smoothing target value at a point in time t1 slightly in the future from the present by calculating (smoothing) a moving average of the PV power actually generated in a predetermined period slightly in the past from the present. In a case where t1 actually arrives, the value of the PV power actually generated at the point in time t1 is subtracted from the smoothing target value at the point in time t1 set earlier, and a charge/discharge instruction is issued to the BESS 4 such that power for compensating for a difference between the values is charged and discharged. The control unit 42 of the BESS 4 performs the charging and discharging of the secondary battery 41 based on the charge/discharge instruction, and as a result, the power in accordance with the smoothing target value is supplied to the load. The BESS 4 notifies the power control device 3 of information such as charge/discharge power or state of charge (SOC). The power control device 3 may calculate the smoothing target value in consideration of maintaining the SOC of the secondary battery 41 in a sound range based on the notified information such as the SOC, in addition to the smoothing of the PV power, and may issue the charge/discharge instruction. As described above, although the smoothing target value is an important instruction value for determining the charge/discharge power of the secondary battery 41 and is determined in consideration of the state (SOC or the like) of the secondary battery 41, the smoothing target value is greatly influenced mainly by a value of a control parameter used in a case where the PV power in the past is smoothed.

The smoothing is, for example, a process of calculating a moving average value, and the control parameter in this case is a moving average time. The calculation of the moving average value is a process of calculating an average value of the PV power in a past predetermined time moment by moment, and the "past predetermined time" is the moving average time (control parameter). In general, in a case where the moving average value is calculated by shortening the moving average time and the value is set as the smoothing target value, the smoothing target value is a value close to the actual PV power, and a charge/discharge amount can be reduced. On the contrary, it is known that in a case where the moving average time is set to be long, the charge/discharge amount increases. From the viewpoint of suppressing the fluctuation in the generated power output, while the fluctuation suppression effect improves in a case where the moving average time is set to be long and the smoothing is realized in a short period of time in a case where the moving average time is set to be short, it is difficult to obtain the fluctuation suppression effect over a long period of time. In a case where the smoothing satisfying certain criteria is not achieved, a power generation company will be penalized.

That is, in a case where the moving average time is set to be short, since the charging and discharging are suppressed, degradation of the secondary battery 41 can be prevented, and the lifetime of the secondary battery 41 can be extended. However, there is an increased risk that the penalty for not achieving the smoothing of the generated power is imposed. On the contrary, in a case where the moving average time is set to be long, the charging and discharging increase, the degradation of the secondary battery 41 accelerates, and a battery replacement frequency increases. However, the risk of the penalty for not achieving the smoothing of the generated power may be reduced. The control parameter calculation device 10 calculates a length (value of control parameter) of the moving average time that appropriately balances the risk of the penalty for not achieving the smoothing of the generated power and the risk of the battery replacement due to the battery degradation, and presents a value of the length to the user of the power supply system 100.

The control parameter calculation device 10 is provided with a data acquisition unit 11, a lifetime prediction unit 12, a smoothing performance prediction unit 13, and a prediction calculation integration unit 14.

The data acquisition unit 11 acquires pieces of information such as an actual value of the PV power in the past, power demand from the load, an initial value of the control parameter (moving average time), a fluctuation range of the control parameter, parameters (initial SOC of the secondary battery 41, absolute temperature, voltage or current related to charging and discharging, and the like) necessary for calculating a degradation amount of the secondary battery 41, smoothing performance, and allowable range of the battery degradation, and stores these pieces of information.

The prediction calculation integration unit 14 calculates, by using the actual value of the PV power in the past acquired by the data acquisition unit 11, the smoothing target value moment by moment in a predetermined evaluation period in a case where a certain value is set as the moving average time and simulates the charge/discharge operation of the secondary battery 41 for achieving the smoothing target value to calculate the charge/discharge power moment by moment. The prediction calculation integration unit 14 stores pieces of information such as the smoothing target value moment by moment in the predetermined evaluation period, the charge/discharge power of the secondary battery 41, and combined power (PV power+charge/discharge power) output by the power supply system 100. The prediction calculation integration unit 14 sets another value for the moving average time to perform the same calculation, simulates the operation of the smoothing system 2 in a case where the value of the moving average time is changed, and stores the smoothing target value, the charge/discharge power, and the like calculated in the process. In this manner, the prediction calculation integration unit 14 calculates and stores the information necessary for the evaluation of the smoothing performance of the power supply system 100 and the degradation evaluation of the secondary battery 41 while variously changing the moving average time. The prediction calculation integration unit 14 evaluates the smoothing performance and a degradation state of the secondary battery 41 (these evaluation indexes are respectively calculated by the smoothing performance prediction unit 13 and the lifetime prediction unit 12), which are obtained as a result of performing various pieces of calculation based on the respective moving average times, to select the moving average time with a good evaluation from the trial moving average times.

The lifetime prediction unit 12 predicts the degradation amount of the secondary battery 41 based on the result of the charge/discharge operation simulated by the prediction calculation integration unit 14. As a method for calculating the degradation amount, a method disclosed in PTL 3 can be used. The lifetime prediction unit 12 calculates a lifetime degradation rate (%/day) per day as the evaluation index based on the calculated degradation amount.

The smoothing performance prediction unit 13 calculates a smoothing performance evaluation index of the power in the evaluation period based on the result of the charge/discharge operation simulated by the prediction calculation integration unit 14. The smoothing performance prediction unit 13 adds the charge/discharge amount moment by moment calculated by the prediction calculation integration unit 14 to the actual value of the PV power at the same time point to calculate the combined power moment by moment, and calculates the smoothing performance evaluation index from fluctuation in the combined power. For example, the smoothing performance prediction unit 13 calculates a fluctuation rate (W/min) of the combined power per unit time as the smoothing performance evaluation index. For example, the smoothing performance prediction unit 13 calculates the fluctuation rate (W/min) of (demand power−combined power) per unit time as the smoothing performance evaluation index. The (demand power−combined power) corresponds to, for example, power that another GTCC power generation plant connected to the power system copes with the output fluctuation of the power supply system 100.

(Operation)

Next, a process of calculating a specific value of the control parameter will be described.

Figure 2:
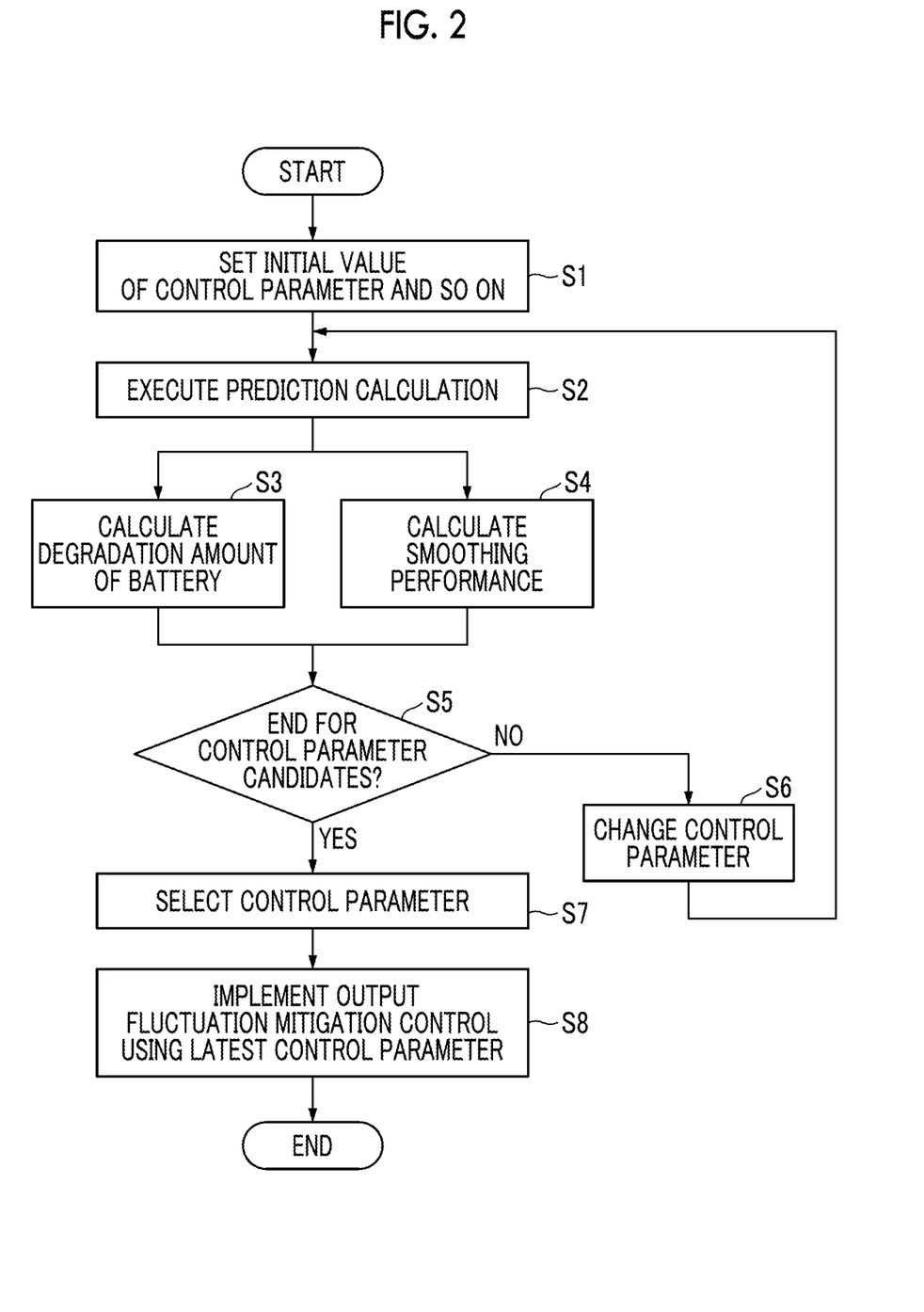
FIG. 2 is a flowchart showing an example of a control parameter calculation process according to the first embodiment.

FIG. 2 is a flowchart showing an example of a control parameter calculation process according to a first embodiment.

First, the user sets an initial value of the control parameter, a fluctuation range of the control parameter, each fluctuation width of the control parameter, an evaluation period, an allowable range of the smoothing performance, an allowable range of battery degradation, and the like (step S1). For example, the user sets 10 minutes as the initial value of the moving average time, 10 minutes to 60 minutes as the fluctuation range, 10 minutes as each fluctuation width, and one year as the evaluation period. With this setting, the prediction calculation integration unit 14 calculates the smoothing target value, the charge/discharge power, and the like moment by moment over one year in a case where the moving average time is set to 10 minutes, 20 minutes, 30 minutes, 40 minutes, 50 minutes, and 60 minutes. In a case where such a calculation is performed, the data acquisition unit 11 acquires the actual value of the PV power for one year in the past. The number of times the fluctuation rate of the combined power exceeds a predetermined threshold value or a total time is set as the allowable range of the smoothing performance, and the lifetime degradation rate per day of less than a predetermined value, state of health (SOH) of the secondary battery 41 one year later of X& or more, or the like is set as the allowable range of the battery degradation. The user can set, in addition to the allowable range, a selection condition such as selecting the moving average time with the least battery degradation or the moving average time with the highest smoothing performance among the moving average times satisfying the allowable range.

In a case where the user issues an instruction to start the calculation, the prediction calculation integration unit 14 sets the initial value for the moving average time and executes prediction calculation (step S2). Here, the prediction calculation is a process (corresponding to simulating the operation of the smoothing system 2 described above) of calculating the charge/discharge amount of the secondary battery 41, the combined power, or the like moment by moment over the evaluation period (for example, one year) in a case where the smoothing target value is calculated based on the set moving average time. Specifically, the prediction calculation integration unit 14 repeatedly performs, with the elapse of time, pieces of calculation such as calculating the smoothing target value for each predetermined time based on the moving average time set as the actual value of the PV power and calculating the charge/discharge power of the secondary battery from the difference between the calculated smoothing target value and the actual value of the PV power to calculate the combined power. In a case where the prediction calculation integration unit 14 calculates the charge/discharge power or combined power in a time series, the lifetime prediction unit 12 calculates the degradation amount of the secondary battery 41 for each predetermined time (step S3). Any known method (for example, method disclosed in PTL 3) can be used for calculating the degradation amount of the secondary battery 41. The lifetime prediction unit 12 may predict the SOH of the secondary battery 41 at the end of the evaluation period by any known method. The lifetime prediction unit 12 divides the calculated degradation amount by the number of days taken for the degradation to calculate the lifetime degradation rate ($/day) per day. The lifetime prediction unit 12 outputs the calculated lifetime degradation rate, SOH, or the like to the prediction calculation integration unit 14. The prediction calculation integration unit 14 stores the lifetime degradation rate, SOH, or the like acquired from the lifetime prediction unit 12.

In parallel with this, the smoothing performance prediction unit 13 calculates the smoothing performance of the power supply system 100 (step S4). For example, the smoothing performance prediction unit 13 calculates, for each predetermined time (for example, 10 minutes), a difference between a maximum value and a minimum value of the combined power calculated by the prediction calculation integration unit 14 to calculate the fluctuation rate (W/min) of the combined power per unit time. Alternatively, the smoothing performance prediction unit 13 calculates, for each predetermined time (for example, 10 minutes), difference between a maximum value and a minimum value of a difference between the combined power calculated by the prediction calculation integration unit 14 and the demand power acquired by the data acquisition unit 11 to calculate the fluctuation rate (W/min) of (demand power–combined power) per unit time. The smoothing performance prediction unit 13 outputs the calculated fluctuation rate and the like to the prediction calculation integration unit 14. The prediction calculation integration unit 14 stores the fluctuation rate and the like acquired from the smoothing performance prediction unit 13.

In a case where the prediction calculation over the evaluation period in a case where the initial value is set for the moving average time, the calculation of the degradation amount of the secondary battery 41 (step S3), and the calculation of the smoothing performance (step S4) are ended, the prediction calculation integration unit 14 determines whether or not the prediction calculation for all control parameter candidates has been ended (step S5). In the case of the above example, the prediction calculation integration unit 14 determines whether or not the prediction calculation in a case where the moving average time is set to 10 minutes, 20 minutes, 30 minutes, 40 minutes, 50 minutes, and 60 minutes is ended. In a case where an uncalculated control parameter remains (step S5; No), the prediction calculation integration unit 14 changes the value of the control parameter (step S6) and repeatedly executes the processes from step S2. For example, the prediction calculation integration unit 14 next sets the moving average time to 20 minutes and executes the processes after step S2.

In a case where the pieces of calculation of steps S2 to S4 are executed for all the control parameter candidates (step S5; Yes), the prediction calculation integration unit 14 selects an optimum control parameter value (step S7). For example, the prediction calculation integration unit 14 compares a lifetime evaluation index (lifetime degradation rate, SOH, or the like) calculated by the lifetime prediction unit 12 for each moving average time with the allowable range of the battery degradation set by the user. In a case where the lifetime degradation rate is calculated for each predetermined time, the prediction calculation integration unit 14 selects an average value or the largest value of the lifetime degradation rate and compares the value with the allowable range of battery degradation. The prediction calculation integration unit 14 compares the SOH with a threshold value set by the user.

Similarly, the prediction calculation integration unit 14 compares the smoothing performance evaluation index calculated by the smoothing performance prediction unit 13 for each moving average time with the threshold value, calculates a total of the number of times the threshold value is exceeded or an exceeding time, and compares the calculated total of the number of times or the exceeding time with a threshold value of the number of times or the exceeding time that is allowable, which is set by the user. The prediction calculation integration unit 14 selects the moving average time in a case where the lifetime degradation rate, SOH, or the like of the secondary battery 41 satisfies the allowable range and the smoothing performance satisfies the allowable range.

In this case, the prediction calculation integration unit 14 may select all the moving average times satisfying the above condition, or may select, based on the selection condition set by the user, the moving average time with the smallest degradation amount of the battery (low lifetime degradation rate or good SOH) or the moving average time with the highest smoothing performance among the moving average times satisfying the allowable range.

Figure 3A:
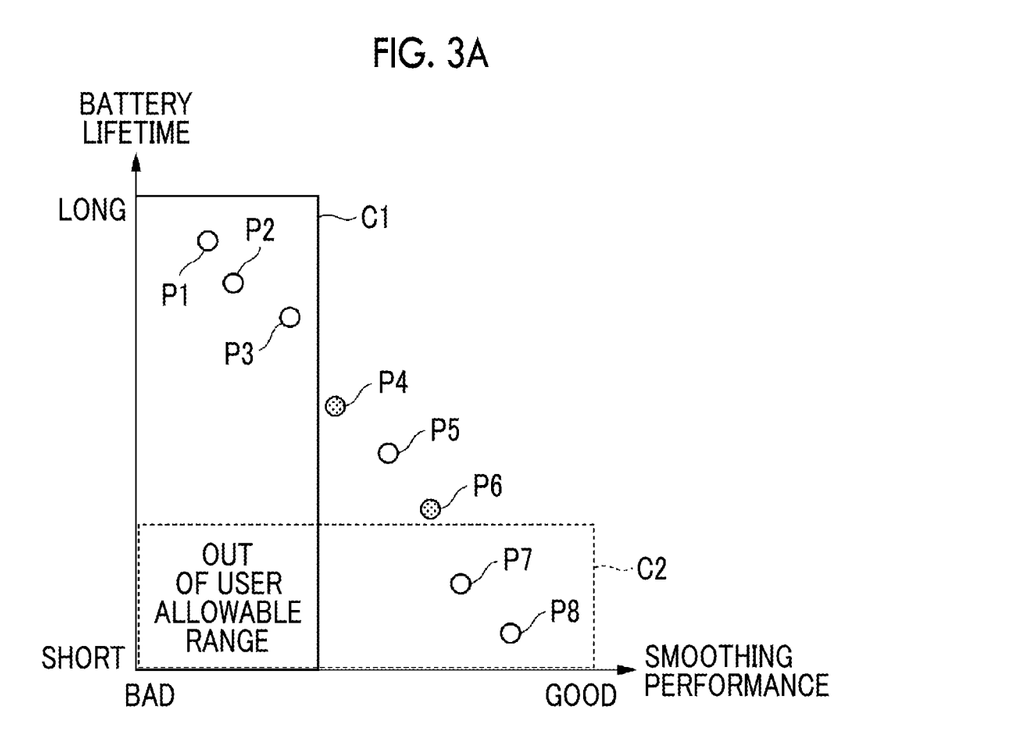
FIG. 3A is a first diagram showing a relationship between a battery lifetime and smoothing performance related to the first embodiment.
Figure 3B:
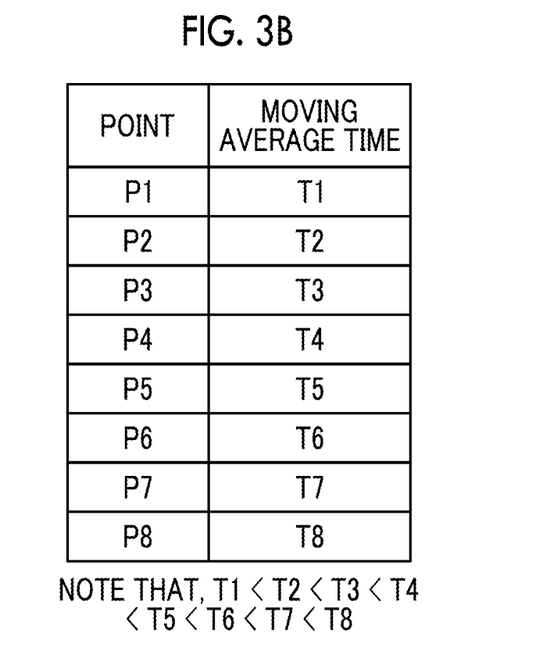
FIG. 3B is a second diagram showing the relationship between the battery lifetime and the smoothing performance related to the first embodiment.

Here, reference is made to FIGS. 3A and 3B. In FIG. 3A, the vertical axis indicates the length of the battery lifetime, and the horizontal axis indicates the smoothing performance. Points P1 to P8 indicate the evaluation values related to the battery degradation and the smoothing performance obtained by the prediction calculation with different moving average times. A relationship between the points P1 to P8 and the moving average time is shown in FIG. 3B. A solid line frame C1 and a broken line frame C2 in FIG. 3A show regions outside the allowable range set by the user. For example, in a case where the user sets the smoothing performance required to be achieved at the minimum and desires the control parameter at which the battery degradation is the least among the control parameters, the solid line frame C1 is out of the allowable range of the user. The prediction calculation integration unit 14 selects a moving average time T4 related to the point P4 at which the battery lifetime is the longest. For example, in a case where the user sets the minimum battery lifetime required to be achieved at the minimum and desires the control parameter at which the smoothing performance is the highest among the control parameters, the broken line frame C2 is out of the allowable range of the user. The prediction calculation integration unit 14 selects a moving average time T6 related to the point P6 at which the smoothing performance is the highest.

In a case where a plurality of selected moving average times are present, the prediction calculation integration unit 14 may output the selected moving average time and characteristics of the battery lifetime and the smoothing performance for the selected moving average time to a display device or an electronic file (not shown), for example, with contents illustrated in FIGS. 3A and 3B, and may urge the user to select a desired moving average time from the moving average times. The user selects the desired moving average time from the presented candidates for the moving average time and inputs the desired moving average time to the control parameter calculation device 10. The prediction calculation integration unit 14 acquires the moving average time input by the user via the data acquisition unit 11.

In a case where one value of the control parameter is selected, the prediction calculation integration unit 14 transmits the selected value of the control parameter to the power control device 3. The power control device 3 calculates the smoothing target value using the latest control parameter (for example, moving average time=30 minutes or the like) and implements output fluctuation mitigation control (step S8).

Thereafter, the moving average time is optimized according to the needs of the user with repetition of the processes of steps S1 to S8 as necessary. In the second and subsequent implementations, a current moving average time (the last calculated control parameter value) may be set as the initial value in step S1 and the processes after step S2 may be executed.

According to the present embodiment, in the power supply system 100, for a control parameter contributing to the lifetime of the secondary battery 41 and the output fluctuation of the combined power, it is possible to determine a specific value of the control parameter satisfying a desired condition for the lifetime of the secondary battery 41 and the output fluctuation. For example, it is possible to a specific length of the moving average time in response to a user's request for extending the battery lifetime even though the smoothing performance by the charging and discharging of the secondary battery 41 is sacrificed to some extent.

Second Embodiment

Next, a method of calculating a control parameter according to a second embodiment will be described with reference to FIGS. 4 to 6.

In the first embodiment, the evaluation values are calculated for the degradation amount or the lifetime of the secondary battery 41 and the smoothing performance on the combined power, and an appropriate value of the moving average time is calculated based on these evaluation values. On the contrary, in the second embodiment, costs related to these two index values are calculated, and the value of the moving average time is selected based on the costs.

Figure 4:
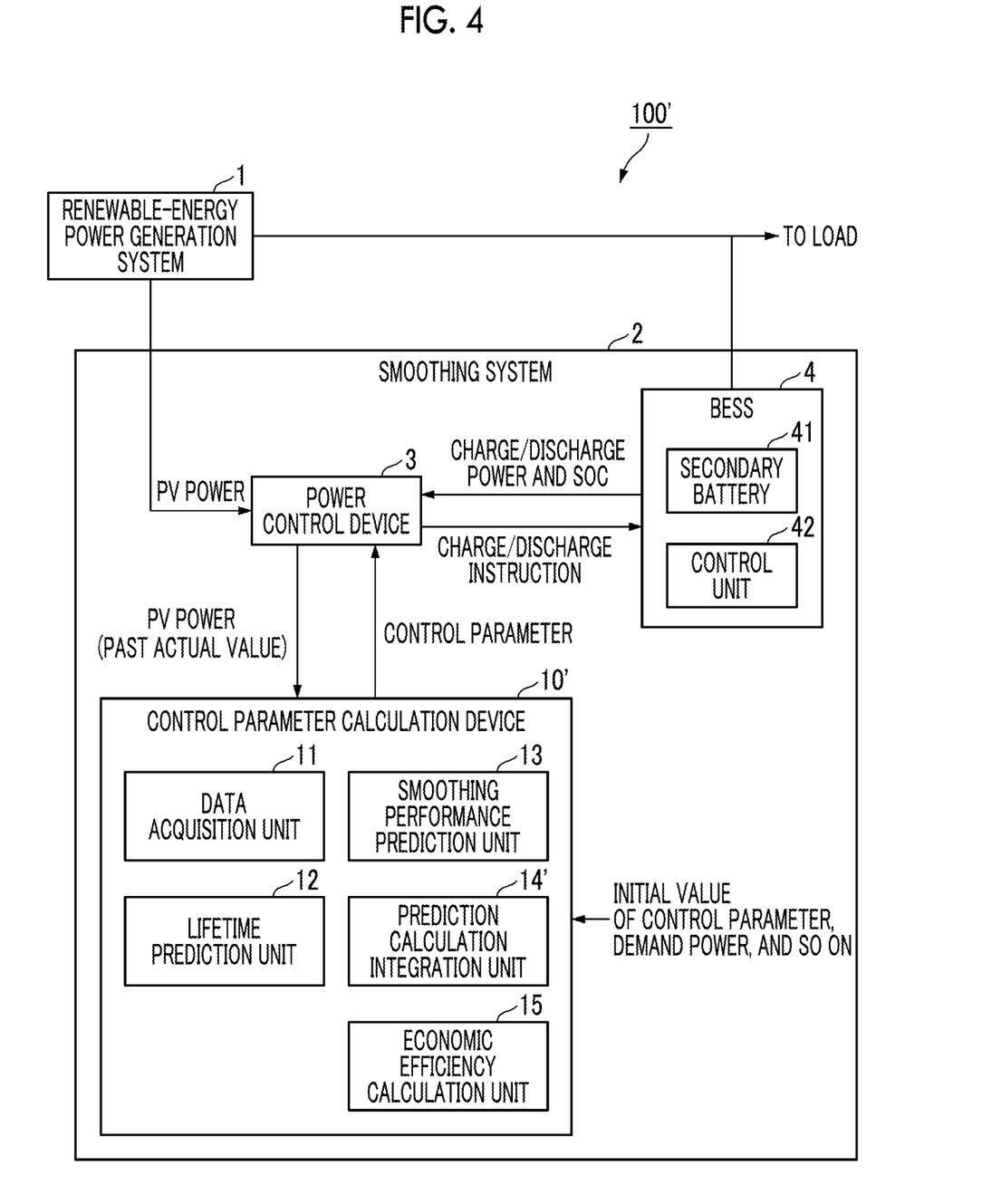
FIG. 4 is a diagram showing an example of a power supply system according to a second embodiment.
Figure 5:
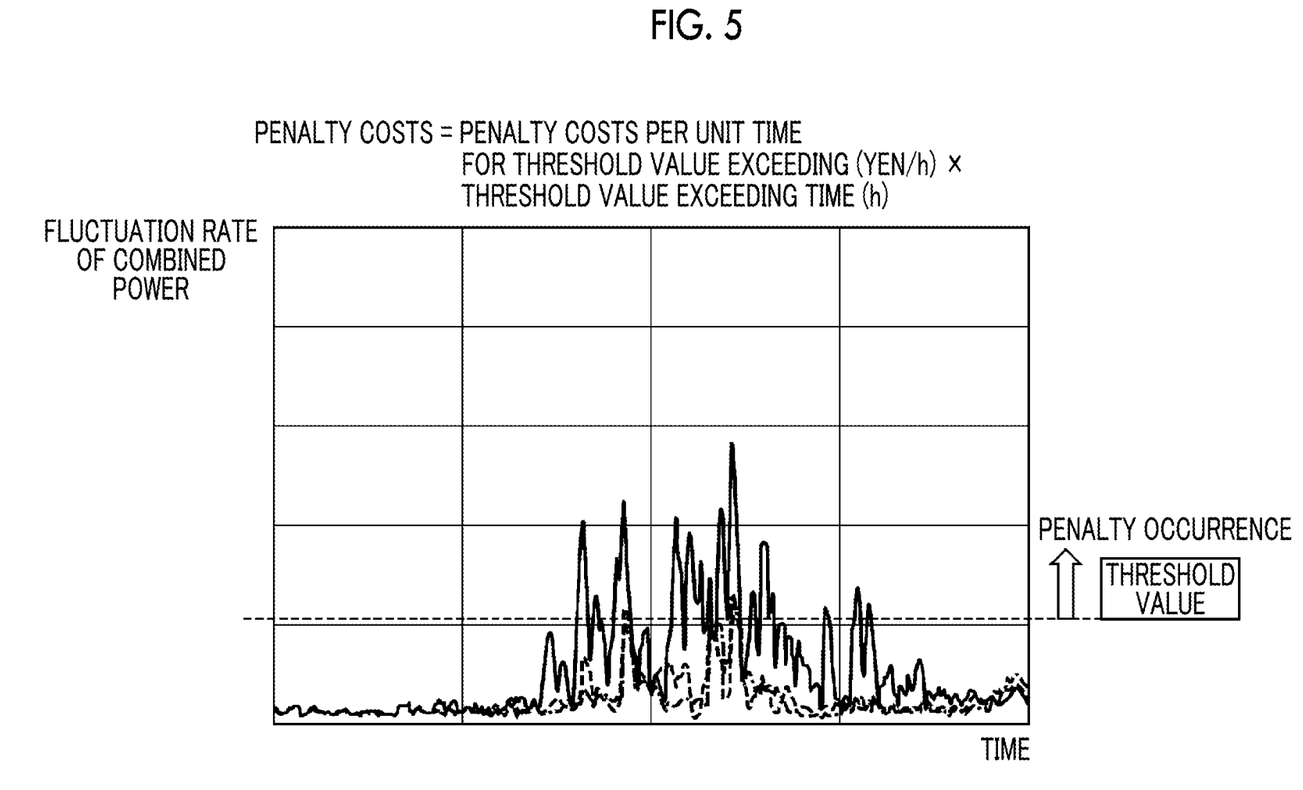
FIG. 5 is a diagram for describing calculation of penalty costs according to the second embodiment.

FIG. 4 is a diagram showing an example of a power supply system according to the second embodiment.

A power supply system 100' according to the second embodiment includes the renewable-energy power generation system 1, the power control device 3, the BESS 4, and a control parameter calculation device 10'. The control parameter calculation device 10' is provided with the data acquisition unit 11, the lifetime prediction unit 12, the smoothing performance prediction unit 13, a prediction calculation integration unit 14', and an economic efficiency calculation unit 15.

The economic efficiency calculation unit 15 calculates penalty costs for the fluctuation in the combined power based on the smoothing performance evaluation index calculated by the smoothing performance prediction unit 13. FIG. 5 shows a method of calculating the penalty costs. The economic efficiency calculation unit 15 calculates a total time during which the fluctuation rate (W/min) of the combined power per unit time exceeds the threshold value. The penalty costs are calculated by multiplying a predetermined penalty unit price by the total exceeding time.

The economic efficiency calculation unit 15 calculates costs related to the replacement of the secondary battery 41 based on the lifetime evaluation index calculated by the lifetime prediction unit 12. For example, the economic efficiency calculation unit 15 calculates, based on the lifetime degradation rate (%/day) of the secondary battery 41 and a threshold value of the lifetime degradation rate in a case where the secondary battery 41 is unusable, how long it will take for the secondary battery 41 to be unusable in a case where the secondary battery 41 is assumed to be degraded at the lifetime degradation rate calculated by the lifetime prediction unit 12 from a predetermined initial state. As a simple example, the economic efficiency calculation unit 15 may calculate, in a case where the initial state of the secondary battery 41 is set to 100%, a value X % obtained by subtracting, from 100%, a value obtained by multiplying the lifetime degradation rate ($/day) by the number of days of use of the secondary battery 41 and calculate the number of days of use until the X % reaches the threshold value. In a case where the calculated number of days of use is reached, the secondary battery 41 may reach the end of its lifetime. For example, in a case where the calculated number of days of use is 365 days and the evaluation period is one year, the economic efficiency calculation unit 15 calculates that the battery replacement occurs once during the evaluation period. In a case where the number of days of use until the threshold value is reached is 730 days (2 years), the economic efficiency calculation unit 15 calculates that battery replacement occurs 0.5 times during the evaluation period. The economic efficiency calculation unit 15 calculates the costs related to the replacement of the secondary battery 41 by multiplying the calculated number of battery replacements during the evaluation period by costs per battery replacement. The costs per battery replacement include, for example, costs required for disposal of an old secondary battery 41, costs required for purchasing of a new secondary battery 41, costs associated with transporting the secondary battery 41, and loss of profit in a case where a power generation opportunity is lost during the replacement of the secondary battery 41. The economic efficiency calculation unit 15 outputs the calculated penalty costs and the costs related to the replacement of the secondary battery 41 to the prediction calculation integration unit 14'.

The prediction calculation integration unit 14' selects the value of the control parameter in a case where a total of the penalty costs and the costs related to the replacement of the secondary battery 41 is minimized.

Since the functions of other configurations are the same as those of the first embodiment, description thereof will be omitted.

(Operation)

Next, a control parameter calculation process in the second embodiment will be described.

Figure 6:
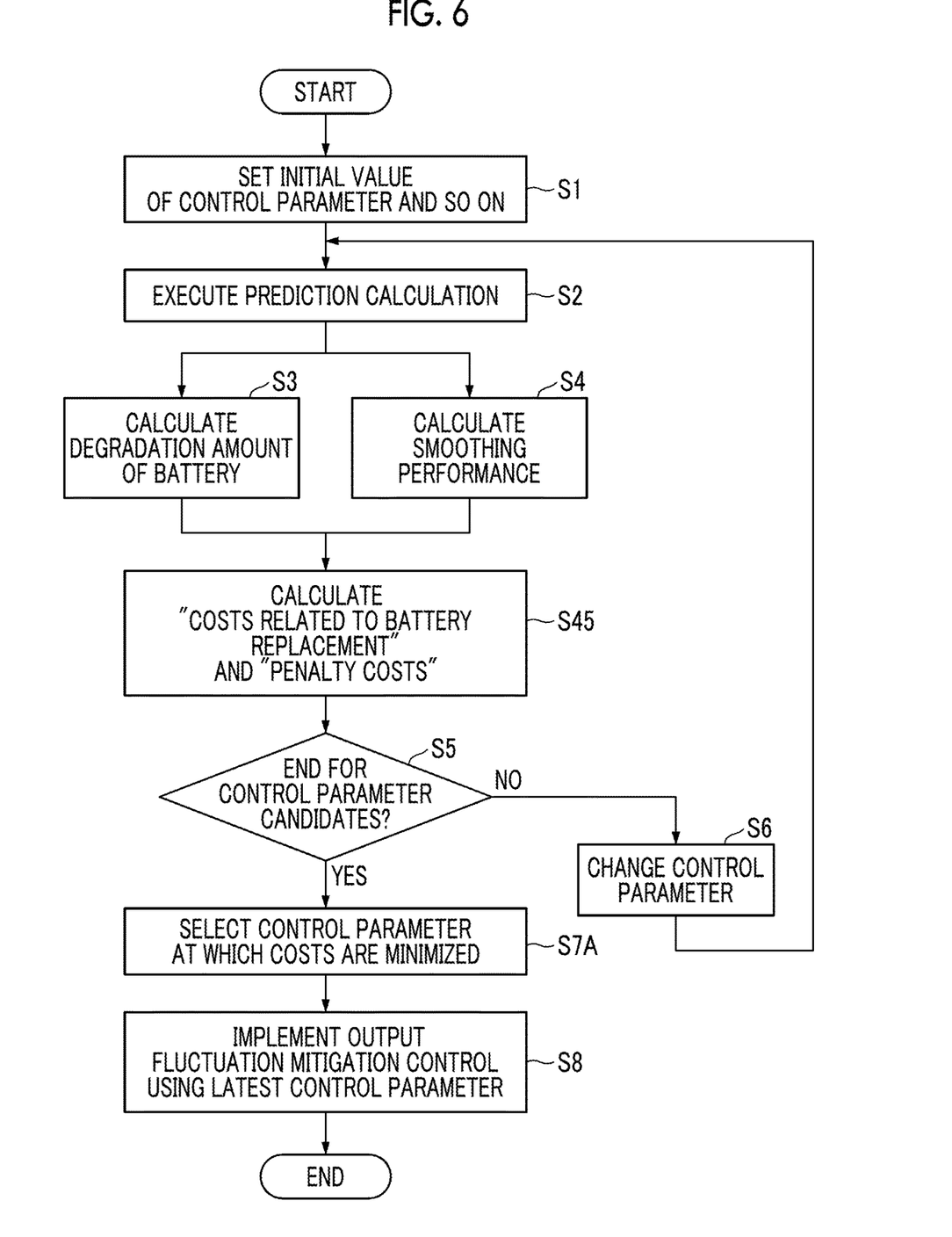
FIG. 6 is a flowchart showing an example of a control parameter calculation s according to the second embodiment.

FIG. 6 is a flowchart showing an example of a control parameter calculation process according to the second embodiment. The description of the same process as that of the first embodiment will be omitted.

First, the user sets the initial value of the control parameter and the like (step S1). In the case of the second embodiment, since the prediction calculation integration unit 14' selects the value of the control parameter in a case where the costs are minimized, it is not necessary to set the allowable range and the like. However, the user may set a cost condition (for example, all of the control parameter values in a case where costs are X yen or less are selected) for the total of the penalty costs and the costs related to the replacement of the secondary battery 41. For example, in a case where a plurality of moving average times satisfying the cost condition are calculated, the prediction calculation integration unit 14' may select all of the plurality of moving average times. With the above, it is possible to select the moving average time in consideration of the smoothing performance and battery degradation while referring to the costs.

Next, the prediction calculation integration unit 14' sets the initial value for the moving average time and executes the prediction calculation (step S2). Next, the lifetime prediction unit 12 calculates the lifetime degradation rate, the SOH, or the like of the secondary battery 41 (step S3). On the other hand, the smoothing performance prediction unit 13 calculates the smoothing performance of the combined power (step S4).

Next, the economic efficiency calculation unit 15 calculates the penalty costs and the costs related to the battery replacement (step S45). For example, the economic efficiency calculation unit 15 calculates the penalty costs and the costs related to the replacement of the secondary battery 41 by the above method. Next, the prediction calculation integration unit 14' determines whether or not the prediction calculation for all the control parameter candidates has been ended (step S5). In a case where an uncalculated control parameter remains (step S5; No), the prediction calculation integration unit 14 changes the value of the control parameter (step S6) and repeatedly executes the processes from step S2. In a case where the pieces of calculation of steps S2 to S45 are executed for all the control parameter candidates (step S5; Yes), the prediction calculation integration unit 14' selects the value of the control parameter at which the costs are minimized (step S7A). For example, the prediction calculation integration unit 14' selects the moving average time in a case where the total of the penalty costs and the costs related to the replacement of the secondary battery 41, which are calculated for each moving average time, is minimized. In a case where the user sets the cost condition, the prediction calculation integration unit 14' may display the characteristics of the battery lifetime and the smoothing performance (FIGS. 3A and 3B) for all the moving average times satisfying the cost condition, and may cause the user to select. In a case where one value of the control parameter is selected, the prediction calculation integration unit 14' transmits the selected value of the control parameter to the power control device 3. The power control device 3 sets the selected value for the moving average time, calculates the smoothing target value, and implements the output fluctuation mitigation control (step S8).

In a case where the smoothing performance is improved, while reducing a chance of penalty occurrence, the degradation of the secondary battery 41 is promoted due to a need for a large amount of charging and discharging in the BESS 4, a battery replacement frequency increases, and the costs increase. The degradation of the secondary battery 41 is suppressed at the sacrifice of the smoothing performance, but the occurrence of penalty increases. In a case where an optimum control parameter (moving average time or the like) is not known from the viewpoint of economic efficiency, the power supply system 100 cannot be operated while minimizing the costs. On the contrary, according to the present embodiment, it is possible to select the optimum control parameter (at which the costs are minimized) from the viewpoint of economic efficiency, based on the lifetime prediction result of the secondary battery 41 and the smoothing performance prediction result.

The first embodiment can be combined with the second embodiment. For example, the user sets the allowable range related to the battery degradation in step S1. In step S7, the prediction calculation integration unit 14' selects the value of the control parameter in a case where the costs are minimized, among the values thereof satisfying the allowable range related to the battery degradation.

(Effects)

As described above, according to the present embodiment, in the power supply system 100 in which the power generated by the renewable-energy power generation system 1 is smoothed by the smoothing system 2, it is possible to calculate the specific value of the control parameters satisfying the desired condition.

Figure 7:
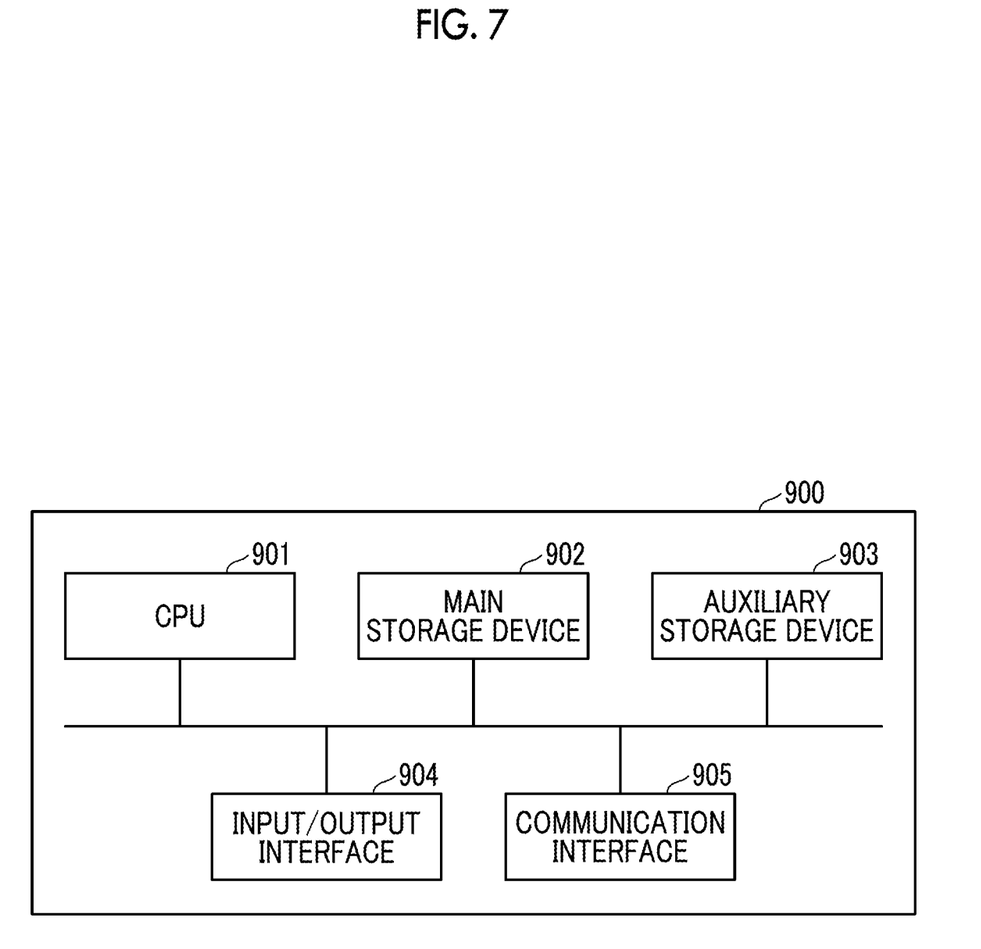
FIG. 7 is a diagram showing an example of a hardware configuration of a control parameter calculation device according to each embodiment.

FIG. 7 is a diagram showing an example of a hardware configuration of the control parameter calculation device according to each embodiment.

A computer 900 is provided with a CPU 901, a main storage device 902, an auxiliary storage device 903, an input/output interface 904, and a communication interface 905.

The control parameter calculation devices 10 and 10' are mounted on the computer 900. Each of the functions described above is stored in the auxiliary storage device 903 in a program form. The CPU 901 reads out the program from the auxiliary storage device 903, expands the program in the main storage device 902, and executes the above process according to the program. The CPU 901 ensures a storage area in the main storage device 902 according to the program. The CPU 901 ensures a storage area for storing data being processed in the auxiliary storage device 903 according to the program.

The process by each functional unit may be performed by recording a program for realizing all or a part of the functions of the control parameter calculation devices 10 and 10' on a computer-readable recording medium and by causing a computer system to read and execute the program recorded on the recording medium. The "computer system" herein includes an OS and hardware such as a peripheral device. The "computer system" also includes a homepage providing environment (or display environment) in a case where a WWW system is used. The "computer-readable recording medium" refers to a portable medium such as a CD, a DVD, or a USB, or a storage device such as a hard disk built into the computer system. In a case where this program is distributed to the computer 900 by a communication line, the computer 900 that receives the distribution may expand the program in the main storage device 902 and execute the above process. The above program may be for realizing a part of the above functions, or may further realize the above functions in combination with a already recorded in the computer system.

As described above, although some embodiments according to the present disclosure have been described, all of these embodiments are presented as examples and are not intended to limit the scope of the invention. These embodiments can be implemented in various other forms, and various omissions, replacements, and changes can be made without departing from the gist of the invention. These embodiments and variations thereof are included in the scope of the invention described in the claims and the equivalent scope thereof, as well as in the scope and gist of the invention.

Additional Notes

The control parameter calculation device, the power supply system, the control parameter calculation method, and the program described in each embodiment are grasped as follows, for example.

(1) A control parameter calculation device 10 according to a first aspect includes an integration unit (prediction calculation integration units 14, 14') that calculates a target value of combined power obtained by totaling first power generated by a renewable-energy power generation system and second power charged and discharged by a battery by smoothing the first power based on a predetermined value of a control parameter, and calculates charge/discharge power in a case where the battery is charged and discharged such that the calculated target value is achieved, a smoothing performance calculation unit (smoothing performance prediction unit 13) that calculates, based on the charge/discharge power calculated by the integration unit over a predetermined evaluation period, a smoothing performance evaluation index of the combined power in the evaluation period, a lifetime calculation unit (lifetime prediction unit 12) that calculates, based on the charge/discharge power calculated by the integration unit over the predetermined evaluation period, a lifetime evaluation index of the battery in the evaluation period, and an evaluation unit (prediction calculation integration units 14, 14') that evaluates the value of the control parameter based on the smoothing performance evaluation index and the lifetime evaluation index calculated using the charge/discharge power repeatedly calculated by the integration unit while changing the value of the control parameter.

Accordingly, it is possible to specifically calculate the optimum control parameter value from the viewpoint of the smoothing performance and the battery lifetime.

(2) The control parameter calculation device according to a second aspect is the control parameter calculation device of (1), in which the smoothing performance evaluation index is a fluctuation rate of the combined power per unit time.

Accordingly, it is possible to calculate the smoothing performance evaluation index.

(3) The control parameter calculation device according to a third aspect is the control parameter calculation device according to (1) to (2), in which the smoothing performance evaluation index is a fluctuation rate per unit time of a value obtained by subtracting the combined power from demand power.

Accordingly, it is possible to calculate the smoothing performance evaluation index.

(4) The control parameter calculation device according to a fourth aspect is the control parameter calculation device according to (1) to (3), in which the lifetime evaluation index is a degradation rate of the battery per unit time.

Accordingly, it is possible to calculate the lifetime evaluation index.

(5) The control parameter calculation device according to a fifth aspect is the control parameter calculation device according to (1) to (4), further including an economic efficiency calculation unit that calculates penalty costs for power fluctuation in the evaluation period based on the smoothing performance evaluation index and calculates costs related to replacement of the battery based on the lifetime evaluation index, in which the evaluation unit evaluates the value of the control parameter based on the penalty costs and the costs related to the replacement of the battery.

Accordingly, it is possible to specifically calculate the control parameter value at which the costs are optimal from the viewpoint of economic efficiency.

(6) Power supply systems 100 and 100' according to a sixth aspect include a renewable-energy power generation system 1, a battery system (BESS 4) provided with one or a plurality of batteries, the control parameter calculation devices 10 and 10' according to any one of (1) to (5), and a power control device 3 that calculates the target value based on the value of the control parameter evaluated by the control parameter calculation device and performs charge/discharge control of the battery system based on a difference between the calculated target value and the power generated by the renewable-energy power generation system.

Accordingly, it is possible to operate the power supply system using the optimized control parameter.

(7) A control parameter calculation method according to a seventh aspect includes a step of calculating a target value of combined power obtained by totaling first power generated by a renewable-energy power generation system and second power charged and discharged by a battery by smoothing the first power based on a predetermined value of a control parameter, and of calculating charge/discharge power in a case where the battery is charged and discharged such that the calculated target value is achieved, a step of calculating, based on the charge/discharge power calculated in the step of calculating the charge/discharge power over a predetermined evaluation period, a smoothing performance evaluation index of the combined power in the evaluation period, a step of calculating, based on the charge/discharge power calculated in the step of calculating the charge/discharge power, a lifetime evaluation index of the battery in the evaluation period, and a step of evaluating the value of the control parameter based on the smoothing performance evaluation index and the lifetime evaluation index, which are calculated by repeatedly performing the step of calculating the charge/discharge power, the step of calculating the smoothing performance evaluation index, and the step of calculating the lifetime evaluation index while changing the value of the control parameter.

(8) A program according to an eighth aspect causes a computer to execute a step of calculating a target value of combined power obtained by totaling first power generated by a renewable-energy power generation system and second power charged and discharged by a battery by smoothing the first power based on a predetermined value of a control parameter, and of calculating charge/discharge power in a case where the battery is charged and discharged such that the calculated target value is achieved, a step of calculating, based on the charge/discharge power calculated in the step of calculating the charge/discharge power over a predetermined evaluation period, a smoothing performance evaluation index of the combined power in the evaluation period, a step of calculating, based on the charge/discharge power calculated in the step of calculating the charge/discharge power, a lifetime evaluation index of the battery in the evaluation period, and a step of evaluating the value of the control parameter based on the smoothing performance evaluation index and the lifetime evaluation index, which are calculated by repeatedly performing the step of calculating the charge/discharge power, the step of calculating the smoothing performance evaluation index, and the step of calculating the lifetime evaluation index while changing the value of the control parameter.

INDUSTRIAL APPLICABILITY

With the control parameter calculation device, the power supply system, the control parameter calculation method, and the program described above, it is possible to calculate the specific value of the control parameter.

REFERENCE SIGNS LIST 100, 100': power supply system
1: renewable-energy power generation system
2: smoothing system
3: power control device
4: BESS
41: secondary battery
42: control unit
10, 10': control parameter calculation device
11: data acquisition unit
12: lifetime prediction unit
13: smoothing performance prediction unit
14, 14': prediction calculation integration unit
15: economic efficiency calculation unit
900: computer
901: CPU
902: main storage device
903: auxiliary storage device
904: input/output interface
905: communication interface

The invention claimed is:

1. A control parameter calculation device comprising:
an integration unit that calculates a target value of combined power obtained by totaling first power generated by a renewable-energy power generation system and second power charged and discharged by a battery by smoothing the first power based on a predetermined value of a control parameter, and calculates charge/discharge power in a case where the battery is charged and discharged such that the calculated target value is achieved;
a smoothing performance calculation unit that calculates, based on the charge/discharge power calculated by the integration unit over a predetermined evaluation period, a smoothing performance evaluation index of the combined power in the evaluation period;
a lifetime calculation unit that calculates, based on the charge/discharge power calculated by the integration unit over the predetermined evaluation period, a lifetime evaluation index of the battery in the evaluation period; and
an evaluation unit that evaluates the value of the control parameter based on the smoothing performance evaluation index and the lifetime evaluation index calculated using the charge/discharge power repeatedly calculated by the integration unit while changing the value of the control parameter.

2. The control parameter calculation device according to claim 1,
wherein the smoothing performance evaluation index is a fluctuation rate of the combined power per unit time.

3. The control parameter calculation device according to claim 1,
wherein the smoothing performance evaluation index is a fluctuation rate per unit time of a value obtained by subtracting the combined power from demand power.

4. The control parameter calculation device according to claim 1,
wherein the lifetime evaluation index is a degradation rate of the battery per unit time.

5. The control parameter calculation device according to claim 1, further comprising:
an economic efficiency calculation unit that calculates penalty costs for power fluctuation in the evaluation period based on the smoothing performance evaluation index and calculates costs related to replacement of the battery based on the lifetime evaluation index,
wherein the evaluation unit evaluates the value of the control parameter based on the penalty costs and the costs related to the replacement of the battery.

6. A power supply system comprising:
a renewable-energy power generation system;
a battery system provided with one or a plurality of batteries;
the control parameter calculation device according to claim 1; and
a power control device that calculates the target value based on the value of the control parameter evaluated by the control parameter calculation device and performs charge/discharge control of the battery system based on a difference between the calculated target value and the power generated by the renewable-energy power generation system.

7. A control parameter calculation method comprising:
a step of calculating a target value of combined power obtained by totaling first power generated by a renewable-energy power generation system and second power charged and discharged by a battery by smoothing the first power based on a predetermined value of a control parameter, and of calculating charge/discharge power in a case where the battery is charged and discharged such that the calculated target value is achieved;
a step of calculating, based on the charge/discharge power calculated in the step of calculating the charge/discharge power over a predetermined evaluation period, a smoothing performance evaluation index of the combined power in the evaluation period;
a step of calculating, based on the charge/discharge power calculated in the step of calculating the charge/discharge power, a lifetime evaluation index of the battery in the evaluation period; and
a step of evaluating the value of the control parameter based on the smoothing performance evaluation index and the lifetime evaluation index, which are calculated by repeatedly performing the step of calculating the charge/discharge power, the step of calculating the smoothing performance evaluation index, and the step of calculating the lifetime evaluation index while changing the value of the control parameter.

8. A program causing a computer to execute:
a step of calculating a target value of combined power obtained by totaling first power generated by a renewable-energy power generation system and second power charged and discharged by a battery by smoothing the first power based on a predetermined value of a control parameter, and of calculating charge/discharge power in a case where the battery is charged and discharged such that the calculated target value is achieved;

a step of calculating, based on the charge/discharge power calculated in the step of calculating the charge/discharge power over a predetermined evaluation period, a smoothing performance evaluation index of the combined power in the evaluation period;

a step of calculating, based on the charge/discharge power calculated in the step of calculating the charge/discharge power, a lifetime evaluation index of the battery in the evaluation period; and a step of evaluating the value of the control parameter based on the smoothing performance evaluation index and the lifetime evaluation index, which are calculated by repeatedly performing the step of calculating the charge/discharge power, the step of calculating the smoothing performance evaluation index, and the step of calculating the lifetime evaluation index while changing the value of the control parameter.

* * * * *